(12) United States Patent
Kamenov et al.

(10) Patent No.: US 8,486,590 B2
(45) Date of Patent: Jul. 16, 2013

(54) REFLECTIVE MASK FOR EUV LITHOGRAPHY

(75) Inventors: Vladimir Kamenov, Essingen (DE); Sascha Migura, Aalen-Unterrombach (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/526,472

(22) Filed: Jun. 18, 2012

(65) Prior Publication Data

US 2012/0320348 A1    Dec. 20, 2012

Related U.S. Application Data

(63) Continuation of application No. PCT/EP2010/070171, filed on Dec. 17, 2010.

(60) Provisional application No. 61/305,717, filed on Feb. 18, 2010.

(30) Foreign Application Priority Data

Dec. 18, 2009  (DE) .................. 10 2009 054 986

(51) Int. Cl.
  *G03F 1/24*   (2012.01)
(52) U.S. Cl.
  USPC ............................................. 430/5
(58) Field of Classification Search
  USPC ................... 430/5; 378/35; 355/53
  See application file for complete search history.

(56) References Cited

U.S. PATENT DOCUMENTS

| 6,262,826 | B1 | 7/2001 | Shafer |
| 7,382,527 | B2 | 6/2008 | Kandaka et al. |
| 7,474,733 | B1 | 1/2009 | Yamamoto |
| 7,572,556 | B2 * | 8/2009 | Mann et al. ................ 430/5 |
| 2005/0271957 | A1 | 12/2005 | Miyachi et al. |
| 2006/0192147 | A1 | 8/2006 | Kandaka et al. |
| 2007/0171327 | A1 | 7/2007 | Matsumodo et al. |
| 2010/0265480 | A1 | 10/2010 | Dodoc |
| 2012/0134015 | A1 | 5/2012 | Paul et al. |

FOREIGN PATENT DOCUMENTS

| DE | 10155711 A1 | 5/2003 |
| DE | 10 2009 017 095 A1 | 10/2010 |
| DE | 10 2009 017 096 A1 | 10/2010 |
| EP | 1434093 A2 | 6/2004 |

OTHER PUBLICATIONS

Kuhlmann., T. et al. "Design and fabrication of broadband EUV multilayer mirrors" Emerging Lithographic Technologies VI, SPIE vol. 4688 (2002).

* cited by examiner

*Primary Examiner* — Stephen Rosasco
(74) *Attorney, Agent, or Firm* — Sughrue Mion, PLLC

(57) ABSTRACT

To improve the mask of an EUV lithography apparatus in view of its high reflectivity, a reflective mask is suggested for EUV lithography having a reflective multilayer system on a substrate configured for a working wavelength in the EUV range and having stacks with layers of at least two materials with different real parts of the refractive index at the working wavelength, wherein the multilayer system (V) is configured such that, as it is irradiated with EUV radiation at a fixed wavelength and an angle interval between the smallest and the largest angle of incidence of up to 21°, the apodization is less than 30%.

29 Claims, 11 Drawing Sheets

REFLECTIVE MASK FOR EUV LITHOGRAPHY

CROSS-REFERENCE TO RELATED APPLICATIONS

This is a Continuation of International Application No. PCT/EP2010/070171, with an international filing date of Dec. 17, 2010, which was published under PCT Article 21(2) in English, and which claims priority to German Patent Application No. 10 2009 054 986.2, with a filing date of Dec. 18, 2009, and also to U.S. Provisional Application No. 61/305,717, with a filing date of Feb. 18, 2010. The entire contents of all three applications are incorporated herein by reference.

FIELD OF AND BACKGROUND OF THE INVENTION

The present invention relates to a reflective mask for extreme-ultraviolet (EUV) lithography, which comprises a reflective multilayer system on a substrate. Furthermore, the present invention relates to an EUV lithography apparatus having such a mask.

In lithographic structuring methods, for example of semiconductor components, the structure of a mask is projected onto an object to be structured using an EUV lithography apparatus. For this purpose, the mask is illuminated with the aid of an illumination system, and its structure is imaged onto the object to be structured with the aid of a projection system.

Light of an increasingly shorter wavelength is used so that increasingly fine structures can be produced in the manufacture of semiconductor components with lithographic methods. If light in the extreme ultraviolet (EUV) wavelength range is used, for example, at a wavelength of between about 5 nm and 20 nm, it is no longer possible to use lens-type elements in a transmission mode, but rather illumination and projection systems constructed of mirror elements each having reflective coatings adapted to the respective working wavelength are used. Masks must also be reflective. In contrast to mirrors in the visible and ultraviolet wavelength ranges, even theoretically only a maximum reflectivity of less than 80% can be achieved per mirror. Since EUV lithography apparatuses usually comprise a plurality of mirrors, each of them must have the highest possible reflectivity in order to ensure sufficiently high overall reflectivity.

Mirrors for the EUV wavelength range around 13 nm with high reflectivity values are known, for example, from DE 101 55 711 A1. The mirrors described there consist of a layer arrangement applied on a substrate, comprising a sequence of individual layers, wherein the layer arrangement comprises a plurality of partial layer systems, each having a periodic sequence of at least two individual layers of different materials forming a period, wherein the number of periods and the thickness of the periods of the individual partial systems decrease from the substrate to the surface. Such mirrors have a reflectivity of more than 30% at an interval of angles of incidence between 0° and 20°, wherein the reflectivity has strong variations in this interval of angles of incidence, however, which can lead to incorrect imaging in the context of an EUV lithography process.

The angle of incidence is defined as the angle between the incident direction of a light beam and the normal on the surface of the mirror at the point of incidence of the light beam on the mirror. The interval of angles of incidence can be derived from the angle interval between the largest and the smallest angle of incidence considered for each mirror.

Mirrors for the EUV wavelength range around 13 nm with high reflectivity values are also known from U.S. Pat. No. 7,474,733 B1. The mirrors shown there have high theoretical reflectivity values for multilayer systems, which consist of more than 30 identical periods of silicon and ruthenium layers for the highest reflectivity values. In practice, these theoretical reflectivity values cannot be achieved however, since intermediate layers are formed through interdiffusion between silicon and ruthenium layers, which leads to a loss of contrast at the layer interface and thus to a reduction in reflectivity. This also applies for the mirrors for EUV lithography known from U.S. Pat. No. 7,382,527 B2, wherein multilayer systems on the basis of silicon and ruthenium layers and multilayer systems on the basis of silicon and molybdenum layers are arranged on top of each other to achieve the highest possible reflectivities.

An EUV lithography apparatus with a mask is known, for example, from EP 1 434 093 A2.

OBJECTS AND SUMMARY OF THE INVENTION

It is an object of the present invention to provide a mask suitable for EUV lithography.

This object is achieved by a reflective mask for EUV lithography comprising a reflective multilayer system on a substrate configured for a working wavelength in the EUV range and having stacks with layers of at least two materials with different real parts of the refractive index at the working wavelength, wherein the multilayer system (V) is configured such that, as it is irradiated with EUV radiation at a fixed wavelength and an angle interval between the smallest and the largest angle of incidence of up to 21°, the apodization is less than 30%.

The apodization is a quantity indicating the variation of the reflectivity at a wavelength within the interval of angles of incidence and is defined as the difference of the maximum reflectivity and the minimum reflectivity in the incident angle interval divided by the maximum reflectivity, which can be indicated in percent. In particular with respect to a high imaging quality of the mask's structure on an object to be structured in the context of an EUV lithography process, it is very advantageous, if the reflection on the mask is as uniform as possible over the largest possible interval of angles of incidence.

The interval of angles of incidence on a mask as it is used in an EUV lithography apparatus, is defined by the numerical aperture and the image scale of the projection objective, which is arranged in the beam path between the mask and the object to be structured by the lithographic process and which images the structure of the mask onto the object to be structured. The interval of angles of incidence is calculated as twice the arc sine of the product of the numerical aperture and the image scale. The mask suggested here has preferably an apodization of less than 30% across the entire interval of angles of incidence for a particular projection objective of an EUV lithography apparatus.

It has been found that multilayer systems, as they are generally used for the reflection of EUV radiation, can be optimized in such a way that they do not reflect the wavelength to which they are adapted at a fixed angle of incidence with very high reflectivity, but with a somewhat reduced reflectivity over an interval of angles of incidence. When illuminating the mask and projecting its structure, this can lead to higher overall reflectivity, if the mask is simultaneously irradiated from several angle of incidence and the mean value of the reflectivity across the interval of angles of incidence due to the special structure of the multilayer system present on the mask is higher than for the conventional multilayer systems that are optimized for a maximum reflectivity at a wavelength in the EUV range and at one angle of incidence.

The multilayer system essentially consists of alternating layers of a slightly less refractive, or more absorbing material at the desired working wavelength, also referred to as an absorber, and a slightly less absorbing material, also referred to as a spacer. By these alternating layers, a crystal is simulated, wherein the layers of less refractive material correspond to the lattice planes, at which Bragg reflections can occur. The thickness of a stack with a layer of a less refractive material and a layer of a more refractive material can be constant or variable across the entire multilayer system, as can the layer thickness ratio within a stack. Additional layers between the alternating layers can also be provided. The first layer on the substrate can be an absorber layer or a spacer layer. The outermost layer facing the vacuum can be both an absorber layer or a spacer layer. Both between the substrate and the multilayer system and on top of the multilayer system towards the vacuum, one or more additional layers can be provided for protecting the underlying multilayer system, for example, or for stress compensation between the substrate and the multilayer system or within the multilayer system.

It should be noted that the working wavelength always corresponds to a wavelength band of finite width in practice, which can be very narrow, however, with respect to the wavelength range of the spectrum of plasma sources, for example, that are used as an EUV radiation source, amongst others.

The reflective mask is an apparatus, with the aid of which it is possible to structure objects in the context of lithography methods, by imaging the structure present on the mask onto the object to be structured. Often, but not always, the structure of the mask is reduced as it is imaged. Depending on the type of lithography method and the configuration of the lithography apparatus, the structure of the mask is imaged in one exposure step, or the structure of the mask is sampled in a stepwise fashion and imaged in more than one exposure step. In the latter case, the mask is also referred to as a reticle. The structure on the mask can be formed as a negative or a positive of the desired structure on the object to be structured. The structure on the mask can also be formed as a layer strongly absorbing the working wavelength. Up to now the masks usually have a planar surface.

Advantageously, the multilayer system is configured such that, as it is irradiated with EUV radiation at a fixed wavelength and an angle interval between the smallest and the largest incident angle of up to 21°, apodization is less than 30%, preferably at an angle interval between the smallest and the largest angle of incidence of up to 14°, apodization is less than 20%.

In preferred embodiments, the multilayer system is configured such that, as it is irradiated with EUV radiation at a fixed wavelength and angle interval between the smallest and the largest angle of incidence of up to 14°, the reflectivity is at least 40%, to achieve a high throughput of objects to be structured when it is used in an EUV lithography apparatus.

Advantageously, the multilayer system is configured in such a way that, as it is irradiated with EUV radiation within a wavelength interval of a width of +/−2% around a center wavelength and an angle interval between the smallest and the largest angle of incidence of up to 12°, apodization is less than 30% to further increase the imaging quality.

It is also advantageous if the multilayer system is configured such that, as it is irradiated with EUV radiation within a wavelength interval of a width of +/−2% around a center wavelength and an angle interval between the smallest and the largest angle of incidence of up to 12°, the reflectivity is at least 30% to ensure sufficient throughput of objects to be structured during the lithography process.

Preferably, the multilayer system present on the mask is configured for maximum reflectivity in a wavelength range between 13.0 nm and 14.0 nm. Most existing EUV lithography apparatuses operate in this wavelength range. Multilayer systems usually exhibit a strong dependency of reflectivity on the wavelength, with a noticeable maximum reflectivity range. The wavelength range with maximum reflectivity can be adjusted by designing and dimensioning the layer sequence and choosing the layer materials.

In preferred embodiments, the multilayer system comprises a plurality of partial systems, each consisting of a periodic sequence of at least two stacks of individual layers, wherein the layers of a stack have a constant thickness within each partial system, resulting in a stack thickness differing from the stack thickness of a neighbouring partial system, and wherein the first layer, having a higher real part of the refractive index of the partial system furthest away from the substrate directly follows the last layer having the higher real part of the refractive index of the partial system second furthest away from the substrate.

Herein, the partial systems of the multilayer system of the reflective mask directly follow one another and are not separated by a further layer or coating system. Furthermore, in the context of the present invention, a partial system is differentiated from a neighbouring partial system, even if the thickness ratio of the layers of material with a different real part of the refractive index at the working wavelength is the same if, as a deviation from the thickness of the stacks of the neighbouring partial systems, there is a deviation of more than 0.1 nm, since a different optical effect of the partial systems otherwise having the same layer thickness ratio can be expected starting at a difference of 0.1 nm.

According to the present invention it has been found that, to achieve a higher and more uniform reflectivity across a greater incident angle interval, the layer of material having a higher real part of the refractive index of the partial system furthest away from the substrate should directly follow the last layer of material having the higher real part of the refractive index of the partial system second furthest away from the substrate.

Preferably, with the present embodiments, in particular, the transmission of the EUV radiation through the partial system furthest away from the substrate and second furthest away from the substrate is less than 10%, preferably less than 2%.

According to the present invention it has been found that to achieve a high and uniform reflectivity across a great interval of angles of incidence, the influence of layers or coatings beneath the multilayer system, or of the substrate, must be reduced. This is necessary, in particular, for a multilayer system where the partial system second furthest away from the substrate has a sequence of stacks, such that the first layer of material having a higher real part of the refractive index of the partial system furthest away from the substrate directly follows the last layer of material with the higher real part of the refractive index of the partial system second furthest away from the substrate. A simple possibility to reduce the influence of layers beneath the multilayer system, or of the substrate, is to configure the multilayer system in such a way that it transmits as little EUV radiation as possible to the layers beneath the multilayer system. In this manner, these layers, or the substrate, are prevented from contributing to the reflectivity properties of the mask in a significant manner.

Advantageously, the multilayer system comprises a plurality of partial systems each consisting of a periodic sequence of at least two stacks of individual layers, wherein the layers of a stack within each partial system have a constant thickness resulting in a stack thickness different from the stack thickness of a neighbouring partial system, and wherein the partial system furthest away from the substrate has a number of stacks which is greater than the number of stacks of the partial system second furthest away from the substrate.

According to the present invention, it has been found that to achieve a high and uniform reflectivity across a large interval of angles of incidence, the number of stacks of the partial system furthest away from the substrate must be greater than that of the partial system second furthest away from the substrate.

Preferably, the multilayer system comprises a plurality of partial systems each consisting of a periodic sequence of at least two stacks of individual layers, wherein the layers of a stack within each partial system have a constant thickness resulting in a stack thickness different from the stack thickness of a neighbouring partial system, and wherein the thickness of the layer with the higher real part of the refractive index of the partial system furthest away from the substrate differs from the thickness of the layer with the higher real part of the refractive index of the partial system second furthest away from the substrate by more than 0.1 nm.

According to the present invention, it has been found that to achieve a high and uniform reflectivity across a large incident angle interval, the thickness of the layer with the higher real part of the refractive index of the layer partial system furthest away from the substrate differs from the thickness of the layer having the higher real part of the refractive index of the layer partial system second furthest away from the substrate by more than 0.1 nm. This applies, in particular, to embodiments where the number of stacks of the partial system furthest away from the substrate is greater than that of the partial system second furthest away from the substrate.

Preferably, the partial systems are made of the same materials since the production of masks is simplified thereby.

Furthermore, it has been found that particularly high reflectivity values can be achieved for a multilayer system with a small number of partial systems, if the stack of the partial system furthest away from the substrate has a thickness of the layer with the lower real part of the refractive index which is smaller than 80% of the thickness of the layer having a smaller real part of the refractive index of the stack of the partial system second furthest away from the substrate.

Also, particularly high reflectivity values can be achieved for a multilayer system with a small number of partial systems, if the stack or the partial system furthest away from the substrate has a thickness of the layer with the higher real part of the refractive index which is more than 120% of the thickness of the layer with the higher real part of the refractive index of the stack for the partial system second furthest away from the substrate.

Advantageously, the multilayer system comprises at least three partial systems, and the number of stacks of the partial system closest to the substrate is greater than that of the partial system furthest away from the substrate and/or greater than that of the layer partial system second furthest away from the substrate. In this way, decoupling of the reflectivity properties from the mask of layers beneath the multilayer system, or from the substrate, is facilitated so that further layers with other functional properties or other substrate materials can be used, for example, to sufficiently protect the layers beneath the multilayer system or the substrate against EUV radiation.

Advantageously, the number of stacks of the partial system second furthest away from the substrate is a value between 2 and 12. It is also advantageous, if the number of stacks of the partial system furthest away from the substrate is a value between 9 and 16. A reflective mask for EUV lithography having a reflective multilayer system, where the number of stacks of the partial system furthest away from the substrate is a value between 9 and 16, or where the number of stacks of the partial system second furthest away from the substrate is a value between 2 and 12, is particularly easy to manufacture. The limitation of the number of layers needed for the mask overall leads to a reduction of the complexity and the risk during manufacture of the mask.

Preferably, the mask has a thickness factor of the multilayer system, which can have values between 0.95 and 1.10 along the mask surface. The thickness factor is the factor realizing all layer thicknesses of a particular multilayer system design, multiplied at one location on the substrate. A thickness factor of 1 thus corresponds to the nominal multilayer design. The thickness factor, as a further degree of freedom, enables different locations on the mask to be more selectively adapted to different incident angle intervals occurring there, without having to change the multilayer system design of the mask as such, so that the mask ultimately provides higher reflectivity values for higher intervals of angles of incidence across different locations on the mask than the associated multilayer system design would allow at a fixed thickness factor of 1. By adjusting the thickness factor, not only can high angles of incidence be ensured, but also apodization can be further reduced. Particularly preferably, the thickness factor of the multilayer system at locations on the mask surface correlates with the maximum angle of incidence occurring there, since, for example, to adapt to a higher maximum angle of incidence, a higher thickness factor can be helpful.

Advantageously, between layers of alternating materials having a higher and lower real part of the refractive index, a barrier layer of boron carbide, carbon, silicon nitride, silicon carbide, silicon boride, molybdenum nitride, molybdenum carbide, molybdenum boride, ruthenium nitride, ruthenium carbide, ruthenium boride or a combination thereof, is arranged. The barrier layers help to reduce interdiffusion between the individual layers of materials with higher or lower real parts of the refractive index and thus keep the contrast within the multilayer system as close to the theoretical ideal value as possible and thus also to keep the actual reflectivity as close as possible to the theoretically ideal value. In preferred variants, barrier layers are arranged between all layers of the materials having different real parts of the refractive index. Depending on the interdiffusion coefficients on the various interfaces between two layers, it can be sufficient to provide a barrier layer at every second interface, or it can be advantageous to provide barrier layers of different thicknesses at different interfaces.

Preferably, at least for one period of the multilayer system with a layer of material having a higher real part and a layer of material having the lower real part of the refractive index at the working wavelength, the material with the higher real part of the refractive index is silicon, and the material with the lower real part of the refractive index is ruthenium, wherein a barrier layer is arranged particularly preferably between some or even all silicon or ruthenium layers. Particularly preferably, all periods include silicon as the material with the higher real part and ruthenium as the material with the lower real part of the refractive index.

Particularly preferably in the latter case, at least one barrier layer of boron carbide having a thickness of more than 0.35 nm, in particular 0.4 nm, is provided, not only to suppress the interdiffusion between silicon and ruthenium but also to help achieve the highest possible reflectivity at various angles of incidence. Advantageously, the multilayer system of the mask should have a barrier layer of boron carbide having a thickness of less than 1 nm, preferably less than 0.8 nm, particularly preferably less than 0.6 nm, since at greater layer thicknesses of the barrier layer, the higher reflectivity values achieved by the barrier layer start to decline due to the absorbing effect of the layers, for example, in the wavelength band around 13 nm to 14 nm. Particularly preferably, for reasons of production technology, there is always a barrier layer of boron carbide of equal thickness of between 0.4 nm and 0.6 nm between the individual layers of silicon and ruthenium, since readjustments of coating processes or coating apparatuses, can thus be avoided. Advantageously, the layers of silicon should have a thickness of between 4 nm and 7 nm and the layers of ruthenium should have a thickness of between 2.5 nm and 4.5 nm. Furthermore, it is advantageous for all other embodiments, if a cover layer system completes the multilayer system of the mask and comprises at least one layer of a chemically inert material to protect the mask against environmental influences and any reflectivity losses caused thereby.

In preferred embodiments, at least for one stack of the multilayer system with one layer of a material having a higher real part and one layer of a material having a lower real part of the refractive index at the working wavelength, the material having the higher real part of the refractive index is silicon and the material having the lower real part of the refractive index is molybdenum. Particularly preferably, all stacks comprise silicon as the material with the higher real part and molybdenum as the material having the lower real part of the refractive index. Multilayer systems on the basis of alternating layers of silicon and molybdenum are particularly suitable for the reflection of EUV radiation at a wavelength in the range of about 13 nm to 14 nm.

Furthermore, the object is achieved by an EUV lithography apparatus comprising a reflective mask for EUV lithography comprising a reflective multilayer system on a substrate configured for a working wavelength in the EUV range and having stacks with layers of at least two materials with different real parts of the refractive index and the working wavelength, wherein the multilayer system is configured such that, as it is irradiated with EUV radiation at a fixed wavelength and an angle interval between the smallest and the largest angle of incidence derived from the numerical aperture and the image scale of a projection objective downstream from the mask, the apodization is less than 30%.

In preferred embodiments, the EUV lithography apparatus comprises a mask as described before.

The above and further features can be seen from the description and the drawings, as well as the claims, wherein the individual features can be realized individually or in groups in the form of subcombinations in an embodiment of the invention, and can also be realized in other fields and can represent advantageous embodiments and also embodiments capable of protection as such.

BRIEF DESCRIPTION OF THE DRAWINGS

The present invention will be explained in more detail with reference to a preferred exemplary embodiment, wherein.

DETAILED DESCRIPTION OF VARIOUS EMBODIMENTS

Figure 1:
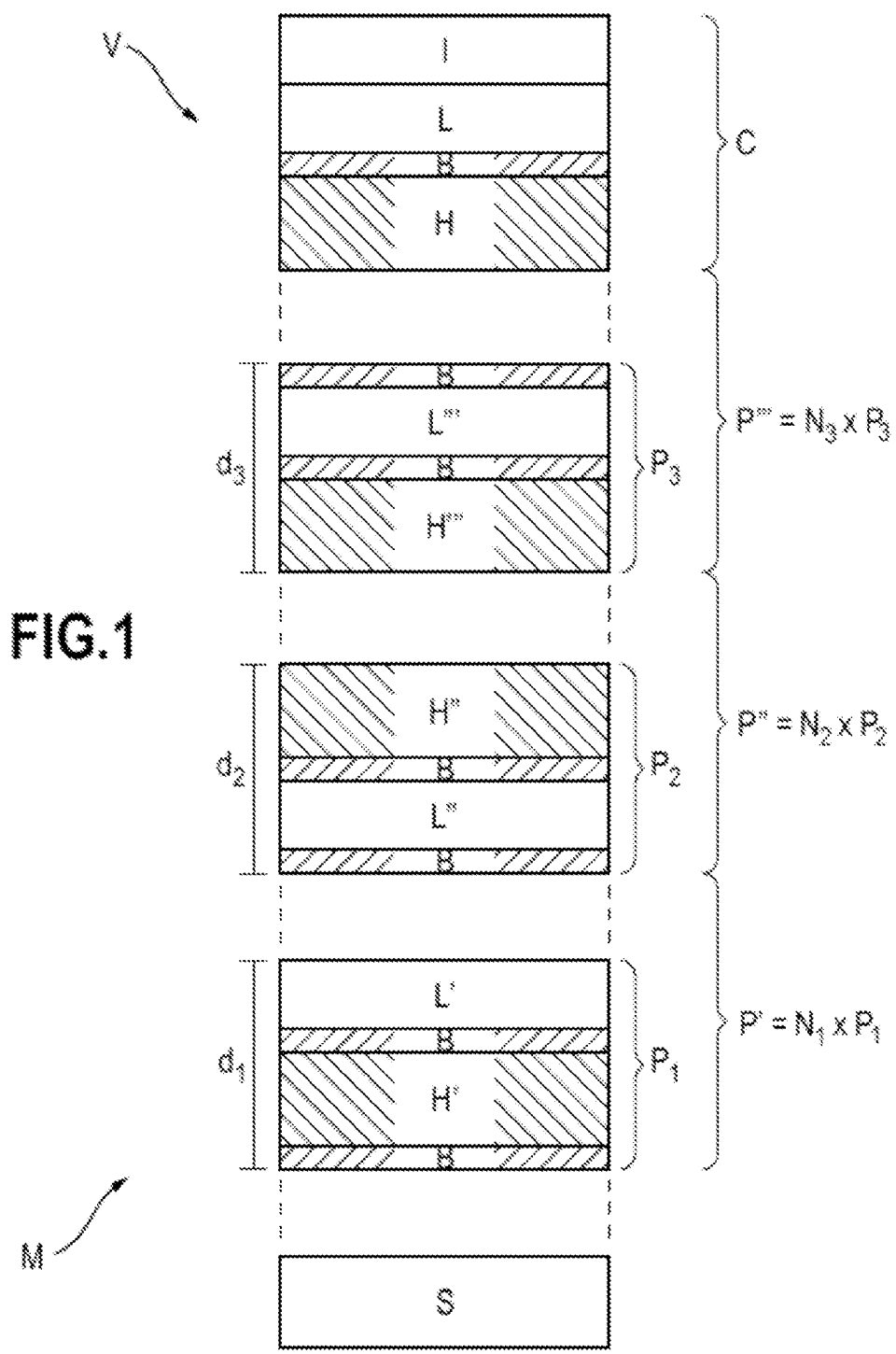
FIG. 1 schematically shows a first embodiment of a mask for EUV lithography with a reflective multilayer system.

Various embodiments of a mask will be described with reference to FIGS. 1 to 4 in an exemplary manner, wherein the same reference numerals will be used throughout the figures to indicate equivalent features. Furthermore, equivalent features or properties of these masks will be described in a summarizing manner for FIGS. 1 to 4 following the description of FIGS. 3 and 4, respectively.

FIG. 1 is a schematic view of a mask M for EUV lithography, comprising a substrate S and a multilayer system V. Herein, the multilayer system V comprises a plurality of partial systems P', P'' and P''', each consisting of a periodic sequence of at least two stacks $P_1$, $P_2$ and $P_3$ of individual layers, wherein the stacks $P_1$, $P_2$ and $P_3$ comprise two individual layers of different materials for a high refractive layer H', H'' and H''' of a material having a higher real part of the refractive index at the working wavelength, at which EUV lithography is carried out, and a low refractive layer L', L'' and L''' of a material having a lower real part of the refractive index, and have a constant stack thickness $d_1$, $d_2$ and $d_3$ within each partial system P', P'' and P''', which differs from the stack thickness of a neighbouring partial system. Herein, the partial system P''' furthest away from the substrate S has a number $N_3$ of stacks $P_3$ larger than the number $N_2$ of stacks $P_2$ of the partial system P'' second furthest away from the substrate S. Additionally, the partial system P'' second furthest away from the substrate S has a sequence of stacks $P_2$, wherein the first high refractive layer H''' of the partial system P''' furthest away from the substrate S directly follows the last high refractive layer H'' of the partial system P'' second furthest away from the substrate S.

Thus, in FIG. 1, the sequence of the high refractive layers H'' and the low refractive layers L'' within stack $P_2$ in partial system P'' second furthest away from the substrate S, is reversed with respect to the sequence of the high refractive layers H', H''' and the low refractive layers L', L''' within the other stacks $P_1$, $P_3$ of the other partial systems P', P''' so that the first low refractive layer L'' of the partial system P'' second furthest away from the substrate S also follows the last low refractive layer L' of the partial system P' closest to the substrate S in an optically effective manner. The partial system P'' second furthest away from the substrate S of FIG. 1 thus also differs in the sequence of the layers from all other partial systems of FIGS. 2 and 3, which will be described in the following.

Figure 2:
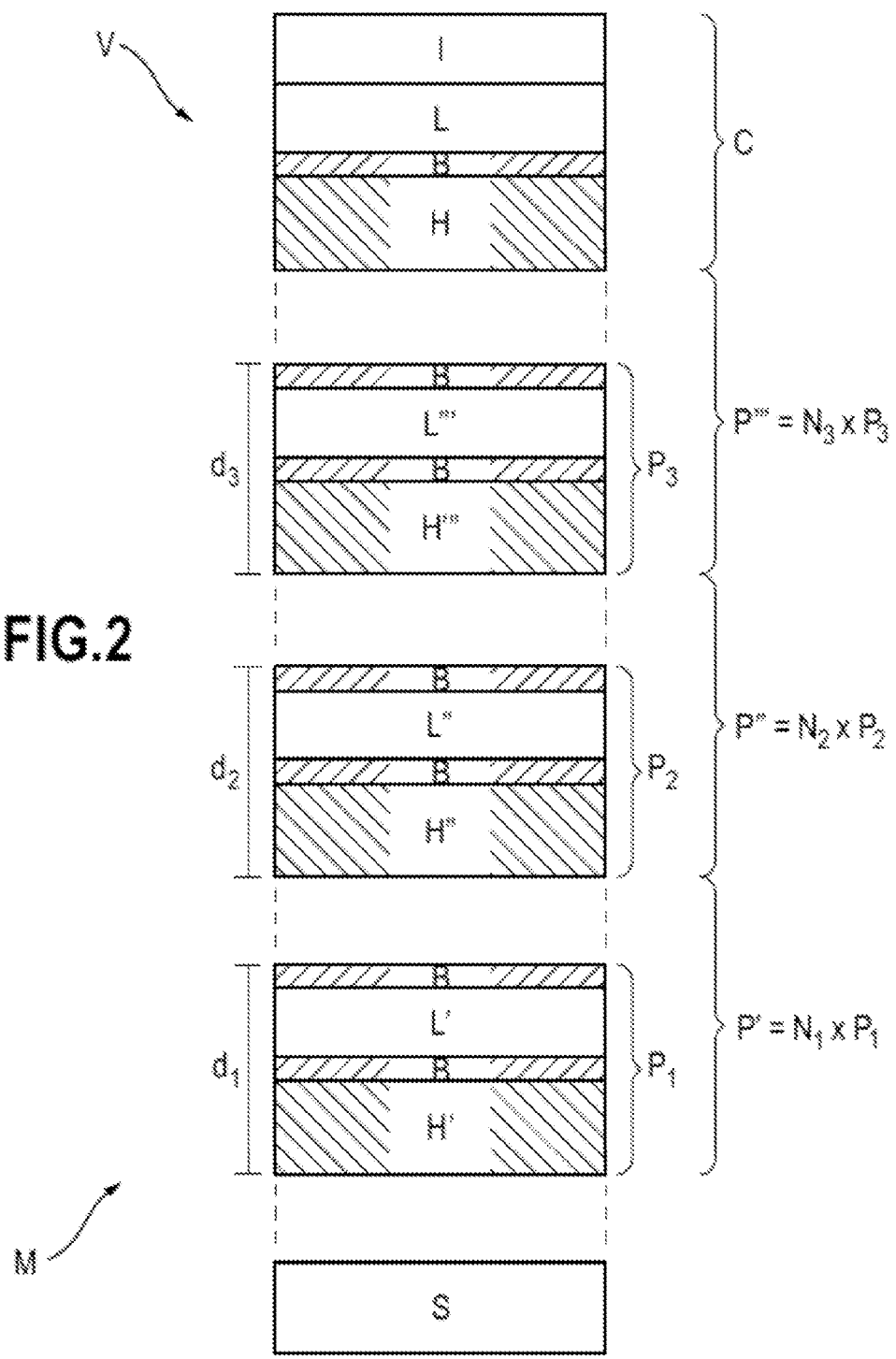
FIG. 2 schematically shows a second embodiment of a mask for EUV lithography with a reflective multilayer system.

FIG. 2 is a schematic view of a further mask M for EUV lithography, comprising a substrate S and a multilayer system V, differing from mask M1 shown in FIG. 1 by the partial system P'' second furthest away from the substrate S, having a layer sequence of stacks $P_2$ corresponding to the layer sequence of the stacks $P_1$ and $P_3$ of the other partial systems P' and P''', so that the first high refractive layer H''' of the partial system P''' furthest away from the substrate S follows the last low refractive layer L'' of the partial system P'' second furthest away from the substrate S in an optically effective manner.

Figure 3:
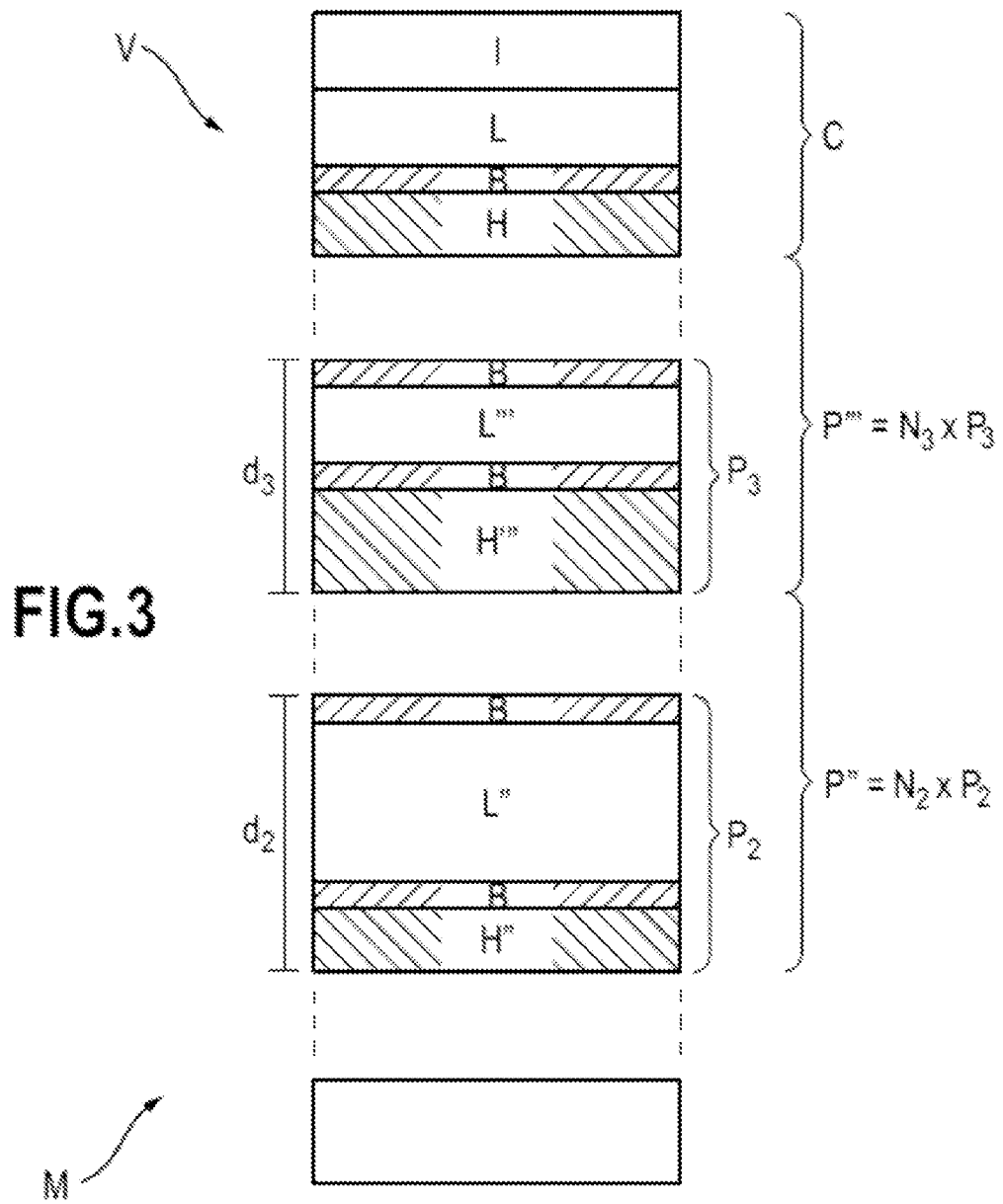
FIG. 3 schematically shows a third embodiment of a mask for EUV lithography with a reflective multilayer system.

FIG. 3 is a schematic view of a third mask M. Here, the multilayer system V comprises a plurality of partial systems P'' and P''' each consisting of a periodic sequence of at least two stacks $P_2$ and $P_3$ of individual layers, wherein the stacks $P_2$ and $P_3$ comprise two individual layers of different materials for a high refractive layer H'' and H''' and a low refractive layer L'' and L''', and has a constant stack thickness $d_2$ and $d_3$ within each partial system P'' and P''', which differs from a stack thickness of a neighbouring partial system. Herein, the partial system P''' furthest away from the substrate has a number $N_3$ of stacks $P_3$ that is greater than the number $N_2$ of stacks $P_2$ of the layer partial system P'' second furthest away from the substrate S. In a variant of this embodiment, as in the mask shown in FIG. 1, the sequence of layers of the partial system P'' second furthest away from the substrate S can be reversed with respect to the partial system P''' furthest away from the substrate so that the first high refractive layer H''' of the partial system P''' furthest away from the substrate S follows the last high refractive layer H'' of the partial system P'' second furthest away from the substrate S in an optically effective manner.

In particular, for a small number of partial systems of, for example, only two partial systems, it can be shown that high reflectivity values are achieved, if the stack $P_3$ of the partial system P''' furthest away from the substrates has a thickness of the high refractive layer H''' that is more than 120%, in particular more than twice the thickness, of the high refractive layer H'' of the stack $P_2$ of the partial system P'' second furthest away from the substrate S.

The partial systems of the multilayer systems of the masks shown in FIGS. 1 to 3 directly follow one another and are not separated by a further layer system. A separation of the partial systems by a single intermediate layer is possible, however, to adapt the partial systems to one another, or to optimize the optical properties of the multilayer system. However, an intermediate layer between two partial systems should not be provided when the high refractive layers directly follow each other, as shown, for example, in FIG. 1, since the desired optical effect would be prevented by reversing the sequence of the layers.

Silicon is the material preferably used for the high refractive layers. Molybdenum and ruthenium are the materials particularly preferred as low refractive layers in combination with silicon. The complex refractive indices of the materials are shown in Table 1.

Between the layers of each stack, preferably either of silicon or molybdenum, or of silicon and ruthenium, in FIGS. 1 to 3, there is a barrier layer B consisting of a material advantageously selected, or composed as a compound, from the group of materials comprising boron carbide, carbon, silicon nitride, silicon carbide, silicon boride, molybdenum nitride, molybdenum carbide, molybdenum boride, ruthenium nitride, ruthenium carbide and ruthenium boride. Such a barrier layer suppresses diffusion between the two individual layers of a stack, whereby the optical contrast is increased at the interface between two individual layers. If molybdenum and silicon are used as the materials for the two individual layers of a stack, a barrier layer above the silicon layer as seen from the substrate, may suffice to achieve sufficient contrast. The barrier layer can also consist of a different material than the ones mentioned above, in particular it can itself comprise two or more layers.

Figure 4:
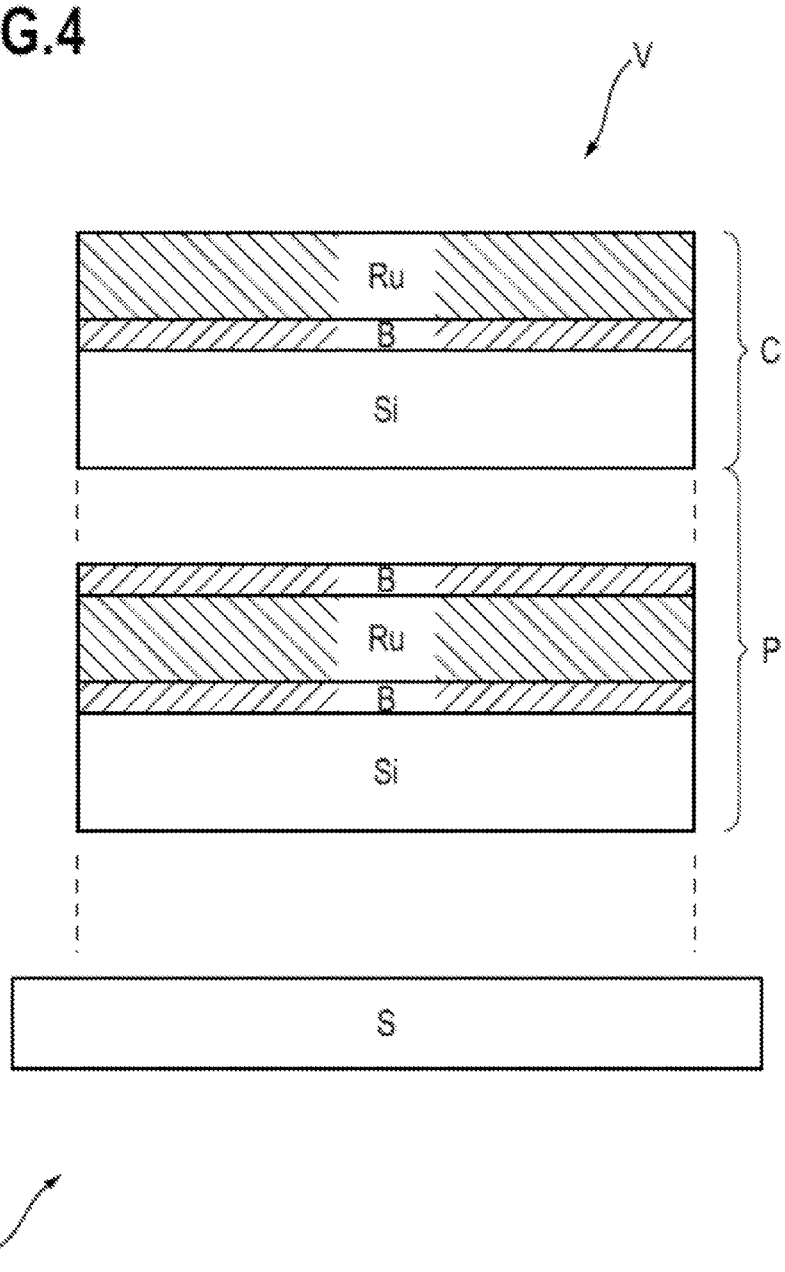
FIG. 4 schematically shows a fourth embodiment of a mask for EUV lithography with a reflective multilayer system.

Barrier layers comprising boron carbide as the material and with a thickness between 0.35 nm and 0.8 nm, preferably between 0.4 nm and 0.6 nm, in practice result in high reflectivity values of the multilayer system. In partial systems of ruthenium and silicon, in particular, as shown in FIG. 4 for a further exemplary embodiment of a mask, barrier layers of boron carbide with values between 0.4 nm and 0.6 nm for the thickness of the barrier layer, exhibit a maximum of reflectivity.

The numbers $N_1$, $N_2$ and $N_3$ of stacks $P_1$, $P_2$ and $P_3$ of partial systems P', P'' and P''' can each amount to up to 100 stacks of the individual stacks $P_1$, $P_2$ and $P_3$ shown in FIGS. 1 to 4. Furthermore, an intermediate layer or an intermediate layer system can be provided between the multilayer systems V and the substrate S as shown in FIGS. 1 to 4, serving for stress compensation between multilayer system V and the substrate S.

As materials for the intermediate layer or the intermediate layer system, the same materials in the same sequence can be used as for the multilayer system V itself. However, barrier layers can be omitted for the intermediate layer system, since its effect on the reflectivity of the mask is usually negligible and thus the question of increasing the contrast with barrier layers is unimportant. Intermediate layer systems of alternating chromium and scandium layers or amorphous molybdenum or ruthenium layers would also be possible as an intermediate layer or intermediate layer system. The thickness of the latter can be chosen such as, e.g. more than 20 nm, so that an underlying substrate is sufficiently protected against EUV radiation. In this case the layers would act as a so-called "Surface Protective Layer" (SPL) and, as a protective layer, would protect against EUV radiation.

The multilayer systems V are completed by a capping layer system C in FIGS. 1 to 3, which comprises at least one layer of a chemically inert material, such as rhodium, platinum, ruthenium, palladium, gold, silicon dioxide etc. as an outermost layer I. This outermost layer I thus prevents the chemical modification of the mask surface due to environmental influences. The capping layer system C in the example shown in FIGS. 1 to 3, apart from the outermost layer I, consists of a high refractive layer H, a low refractive layer L and a barrier layer B.

The thickness of one of the stacks $P_1$, $P_2$ and $P_3$, as can be seen in FIGS. 1 to 3, results from the sum of the thicknesses of the individual layers of the corresponding period, i.e. from the thickness of the high refractive layer, the thickness of the low refractive layer, and, as the case may be, the thickness of two barrier layers. The partial systems P', P'' and P''' in FIGS. 1 to 3 can thus be differentiated from each other by their stacks $P_1$, $P_2$ and $P_3$ having different thicknesses $d_1$, $d_2$ and $d_3$. Different partial systems P', P'' and P''' in the context of the present invention, are thus understood as being partial systems having stacks $P_1$, $P_2$ and $P_3$ differing in their thicknesses $d_1$, $d_2$ and $d_3$ by more than 0.1 nm, since below a difference of 0.1 nm, a different optical effect of the partial systems with otherwise the same layer thickness ratios between the high and the low refractive layer within one stack cannot be expected. Furthermore, partial systems, which are the same as such, can vary by this amount in their stack thicknesses, when manufactured on different production systems.

Figure 5:
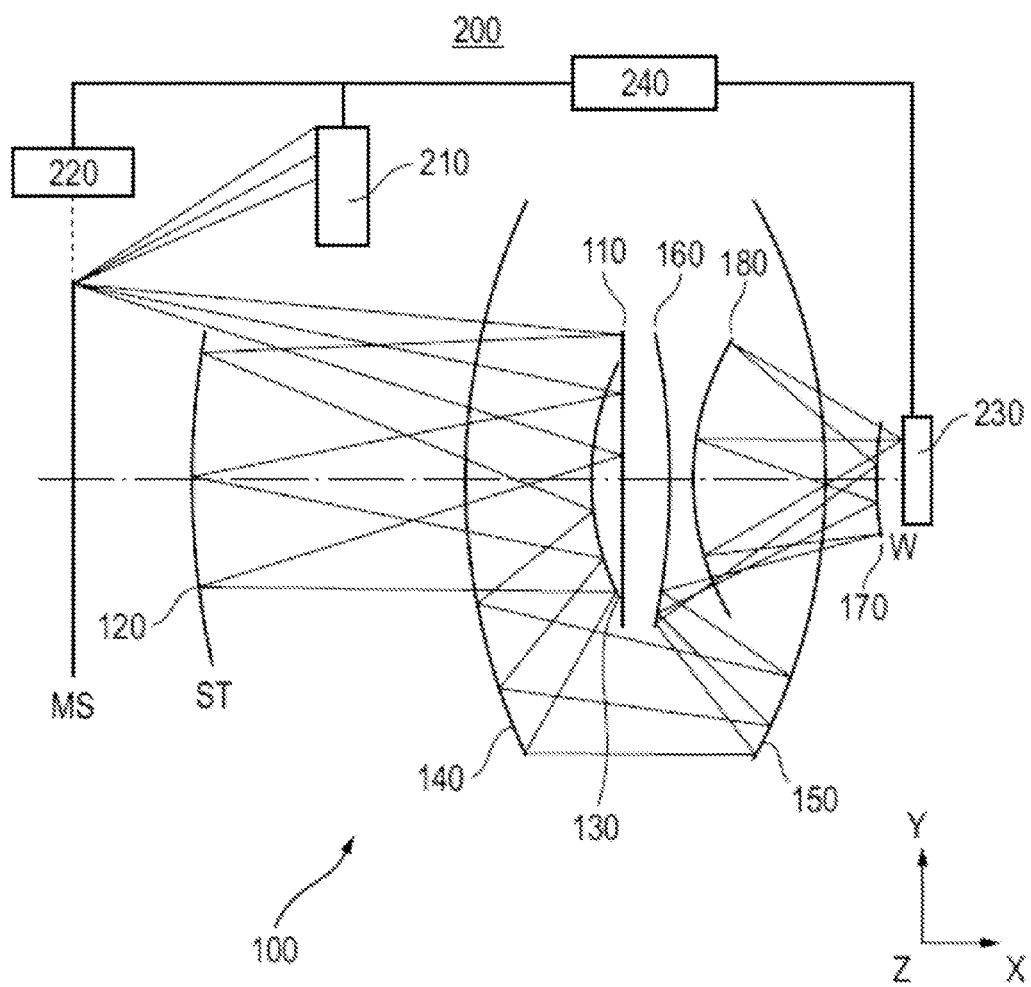
FIG. 5 schematically shows a basic sketch of an EUV lithography apparatus with a mask as suggested here.

FIG. 5 schematically shows an EUV lithography apparatus 200, in which a mask MS, as described above, is used. EUV radiation, which is processed by an illumination system 210 using various mirrors (not shown) with respect to its optical properties, is used in a so-called step-and-scan method to scan the structure on the mask MS in the y direction for example, in a stepwise manner and to image it in corresponding subsequent exposure steps with the aid of the projection system 100 with a sequence of mirrors, in the present example 8 mirrors 110, 120, 130, 140, 150, 160, 170, 180, onto a wafer. To coordinate the movements of the mask support 220 and the wafer support 230 in a corresponding manner, a control unit 240 is provided.

The EUV radiation in the range of the working wavelength, at which the lithographic process is carried out, is processed with the aid of the illumination system 210 in such a manner, that, as the mask MS is scanned, the respective section is illuminated in a manner as homogeneous as possible. If attempts are made to increase the numerical aperture of the EUV lithography apparatus 200, in particular of the projection system 100, to increase the resolution of the image, the variation of the angle of incidence of the radiation incident on the mask also increases at each illuminated point.

If a conventional mask is considered with the usual coating on the basis of molybdenum and silicon as alternating materials of different real parts at an ideal working wavelength of 13.5 nm in this example, or a real working wavelength band of 13.2 nm to 13.8 nm in the present case, it can be found that the apodization is very high in part.

To calculate the reflectivity values shown in the following figures, the complex refractive indices $\tilde{n}=n-i*k$ were used for the materials utilized at the wavelength of 13.5 nm. It must be noted that reflectivity values of real masks can be lower than the theoretical reflectivity values shown here, since the refractive indices of real thin layers in particular, can deviate from the literature values indicated in table 1.

TABLE 1 refractive indices $\tilde{n} = n - i*k$ for 13.5 nm

| Material | Symbol chemical | Symbol layer design | n | k |
|---|---|---|---|---|
| Substrate | | | 0.973713 | 0.0129764 |
| Silicon | Si | H, H', H", H'" | 0.999362 | 0.00171609 |
| Boron carbide | $B_4C$ | B | 0.963773 | 0.0051462 |
| Molybdenum | Mo | L, L', L", L'" | 0.921252 | 0.0064143 |
| Ruthenium | Ru | L, L', L", L'" | 0.889034 | 0.0171107 |
| Vacuum | | | 1 | 0 |

The multilayer system of the conventional mask has the following structure:
substrate/.../(0.4 $B_4C$ 2.799 Mo 0.4 $B_4C$ 3.409 Si)*50/5.275 Si 0.4 $B_4C$ 2.0 Mo 1.5 Ru.

The structure of the stack is indicated in parentheses with thickness indications in nanometres, which is periodically repeated fifty times. The multilayer system is completed with a protective layer system of one layer of Si, one layer of Mo and one layer of Ru towards the vacuum as a relatively inert material.

Figure 6:
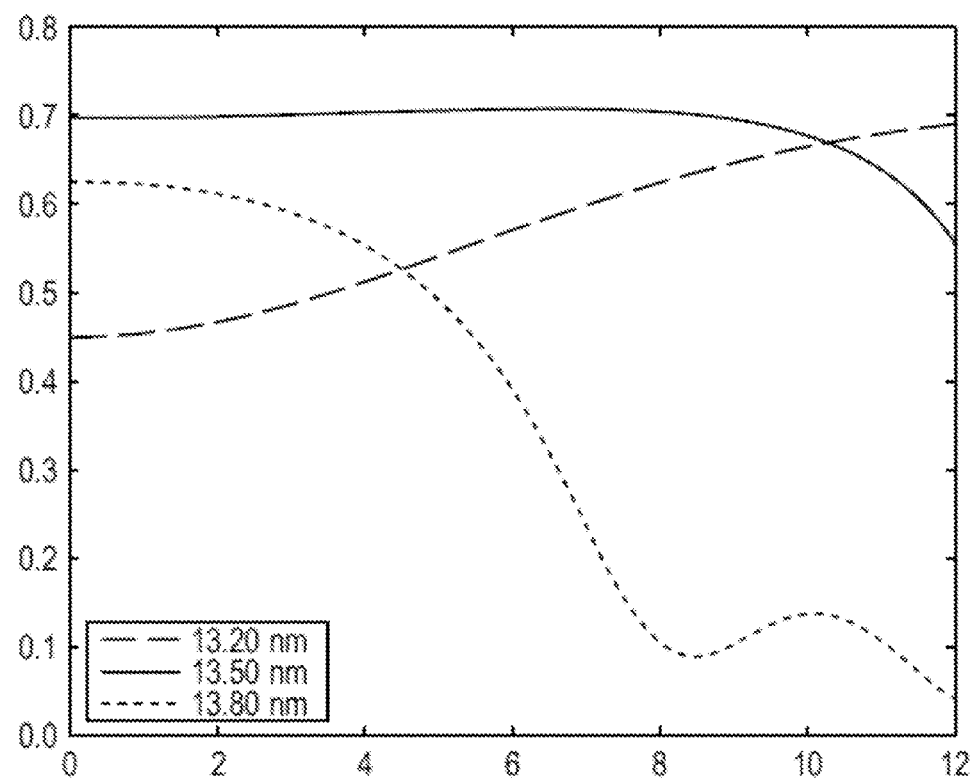
FIG. 6 shows the reflectivity as a function of the angle of incidence for several wavelengths of a conventional mask.
Figure 7:
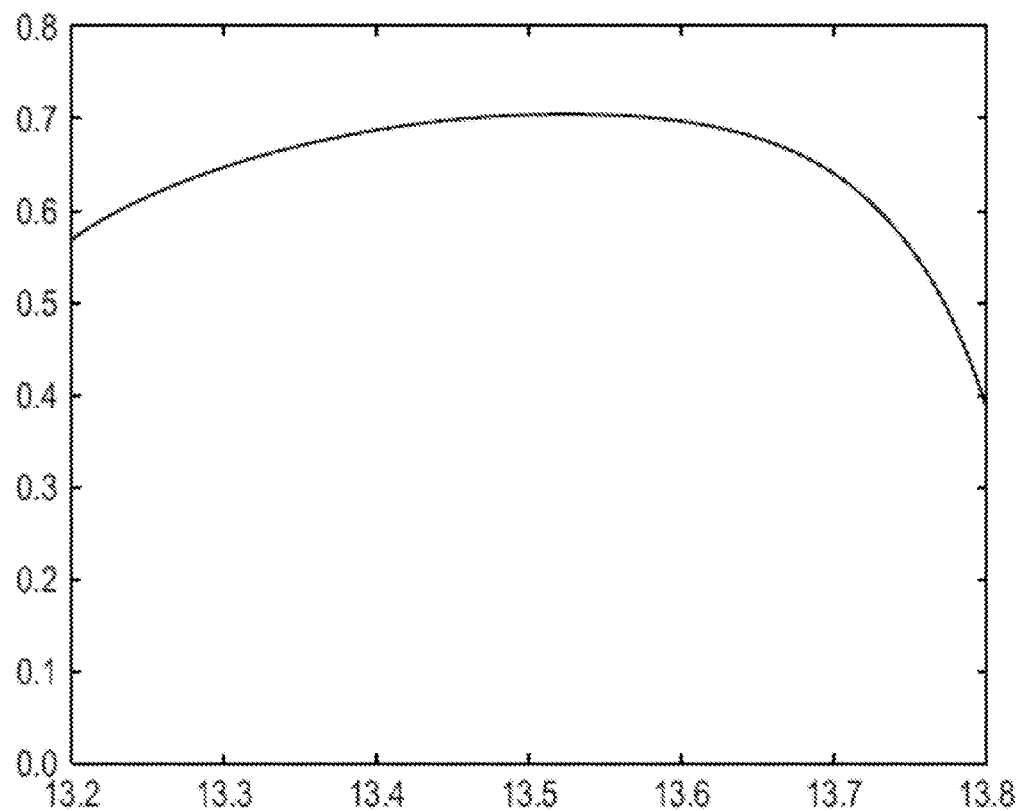
FIG. 7 shows the reflectivity as a function of the wavelength for an angle of incidence of a conventional mask.

FIG. 6 shows the dependency of the reflectivity on the angle of incidence for 13.2 nm, 13.5 nm and 13.8 nm as representative for the entire working wavelength band of 13.5 nm+/−0.3 nm, in the present example. FIG. 7 shows the wavelength dependency of the reflectivity for the working wavelength band for the angle of incidence of 6° in an exemplary manner. An apodization of 32% at 13.2 nm, of 4% at 13.5 nm and 85% at 13.8 nm results for an interval of angles of incidence of 10° about a central angle of incidence of 6° in the present example, i.e. from 1° to 11°, which corresponds, for example, to a numerical aperture NA of 0.35 with an image scale of 1:4 of the projection objective of the EUV lithography apparatus, as can be seen from the reflectivity profiles shown in FIG. 6. The apodization may be very small at the ideal working wavelength, for which the multilayer system is configured. But as soon as there is a deviation from the ideal case, the apodization increases strongly. The apodization is even larger, if an interval of angles of incidence of 12° around 6° is considered, i.e. from 0° to 12°, which would correspond to a numerical aperture NA of 0.4 at an image scale of 1:4. In this case the apodization is 34% at 13.2 nm, 21% at 13.5 nm and 93% at 13.8 nm. With this strong apodization, using the hitherto known EUV lithography apparatuses, a sufficiently uniform and faultless structuring of wafers, for example, can be ensured only with difficulty.

Figure 8:
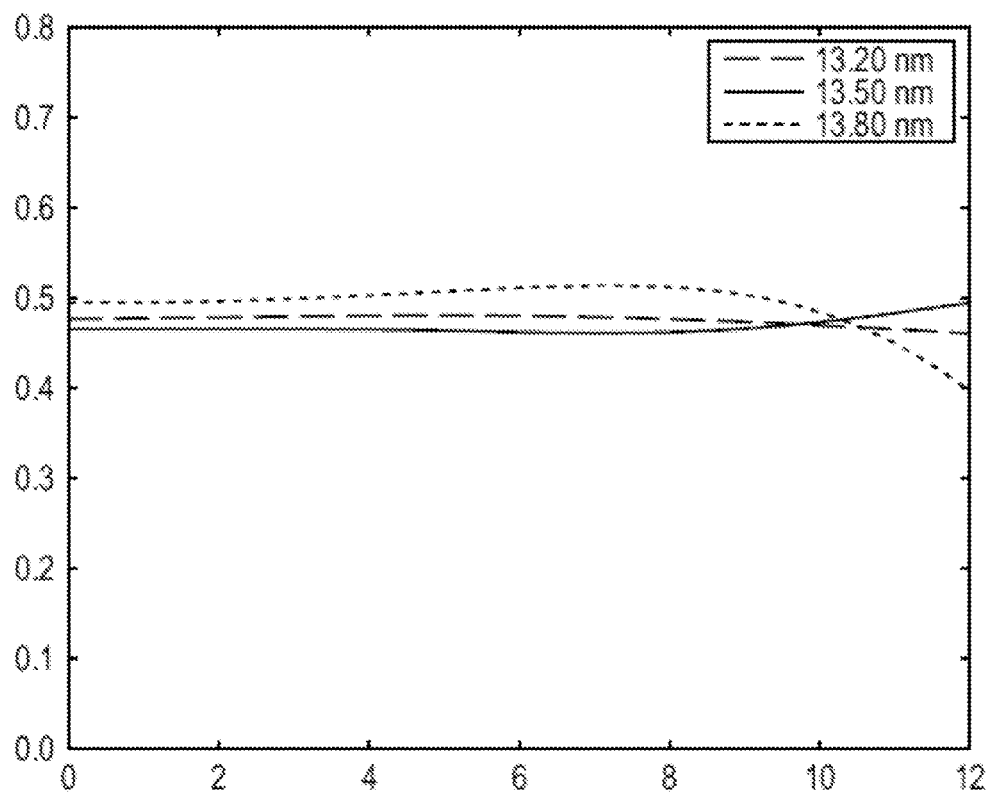
FIG. 8 shows the reflectivity as a function of the angle of incidence for several wavelengths of a mask as shown in FIG. 1.
Figure 9:
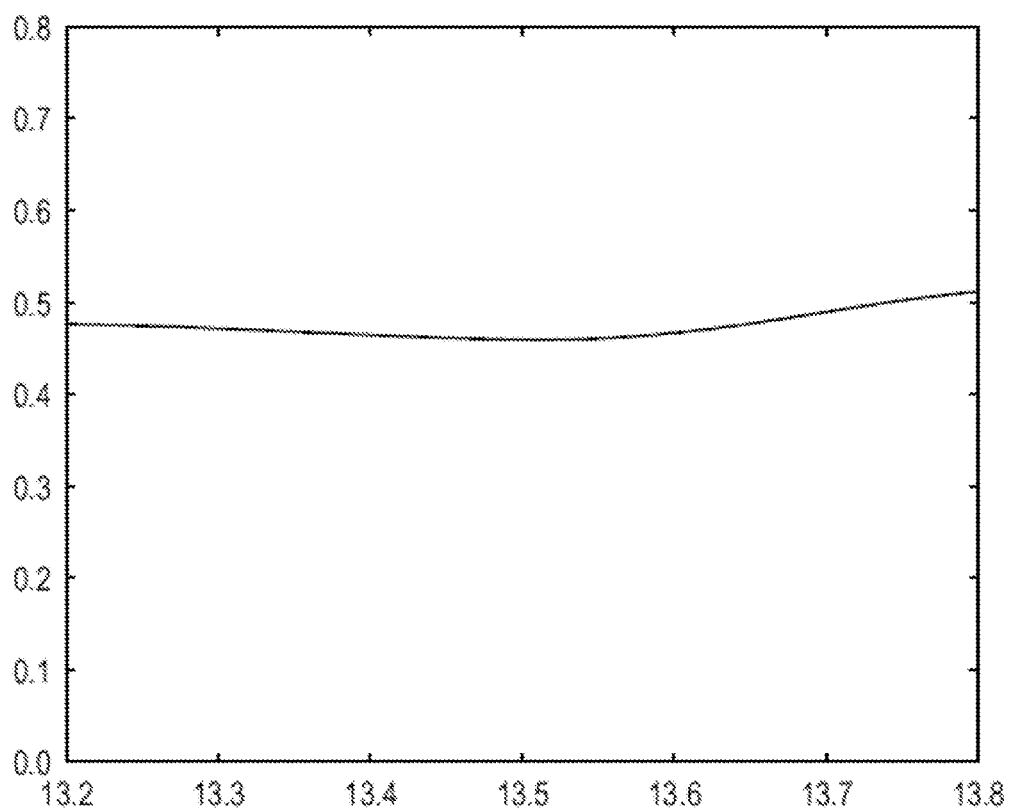
FIG. 9 shows the reflectivity as a function of the wavelength for an angle of incidence of a mask as shown in FIG. 1.

However, if the EUV lithography apparatus has a mask as suggested here, a uniform and faultless structuring of wafers, for example, can be more easily ensured. FIGS. 8 and 9 show the reflectivity profiles equivalent to FIGS. 6 and 7 that were calculated for the following structure:
substrate/.../(0.373 $B_4C$ 2.725 Si 0.373 $B_4C$ 4.601 Mo)*8/(0.373 $B_4C$ 3.867 Mo 0.373 $B_4C$ 2.716 Si)*5/(3.274 Si 0.373 $B_4C$ 3.216 Mo 0.373 $B_4C$)*16/2.975 Si 0.373 $B_4C$ 2 Mo 1.5 Ru This structure corresponds to the mask shown in FIG. 1. In this multilayer system, three partial systems are arranged one on top of the other, wherein the layer sequence of the partial system second furthest away from the substrate is inverted in comparison to the neighbouring partial system so that the first silicon layer of the partial system furthest away from the substrate follows the last silicon layer of the partial system second furthest away from the substrate. The stack number and the layer thickness of the partial systems are configured in such a manner that the transmission of EUV radiation through the partial system furthest away from the substrate and the partial system second furthest away from the substrate is less than 10%. Moreover, the number of stacks within the partial systems is chosen such that the partial system furthest away from the substrate has a larger number of stacks than the partial system second furthest away from the substrate. Herein, the thickness of the silicon layers in the stacks of the partial system second furthest away from the substrate differs by more than 0.1 nm from the thicknesses of the silicon layers of the partial system furthest away from the substrate.

The mask with this multilayer system has a substantially lower apodization than the conventional mask shown in FIG. 8. At an interval of angles of incidence of 10°, i.e. NA=0.35 and an image scale of 1:4, the apodization is 3% at 13.2 nm, 3% at 13.5 nm and 6% at 13.8 nm. At an interval of angles of incidence of 12°, i.e. NA=0.40 and an image scale of 1:4, the apodization is 4% at 13.2 nm, 7% at 13.5 nm and 23% at 13.8 nm. Herein, the reflectivity over the entire interval of angles of incidence is 0.4 or more, as also shown in FIG. 9 for the angle of incidence of 6°.

Figure 10:
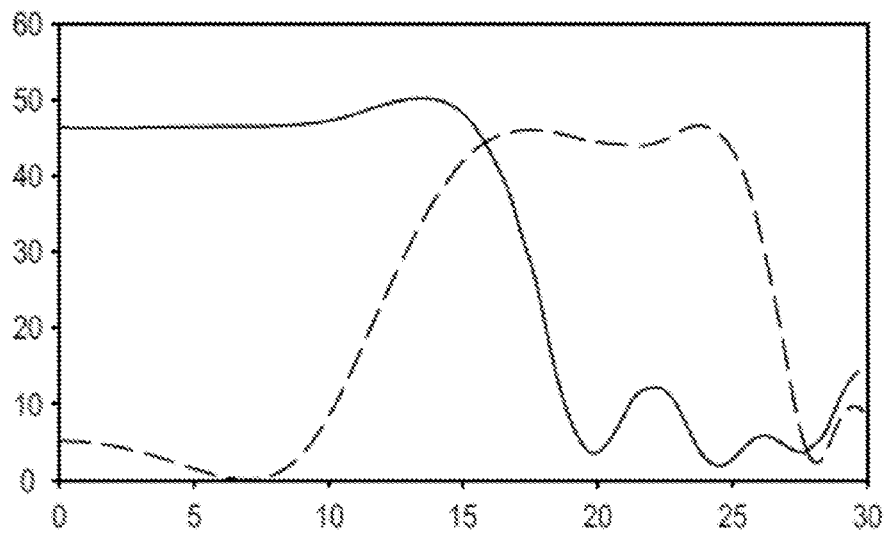
FIG. 10 shows the reflectivity as a function of the angle of incidence for a wavelength of a mask as shown in FIG. 1 with varying thickness factors.

FIG. 10 shows the reflectivity as a function of the incident angle for 13.5 nm, also for greater angles of incidence (solid line). The apodization is very low also for greater incident angle intervals and thus numerical apertures above 0.40. In addition, FIG. 10 shows the reflectivity for the above-mentioned structure with a broken line, but with a thickness factor of 1.07. This results in the reflectivity plateau being displaced towards higher angles of incidence. In the interval of angles of incidence, in which there is the reflectivity plateau, the apodization of a mask with a multilayer system with a thickness factor (broken line) is hardly higher than for the thickness factor 1.00. If the geometry of the EUV lithography apparatus leads to high angles of incidence on the mask, low apodization can still be guaranteed by adjusting the multilayer system by a thickness factor in a corresponding manner. If particularly large surfaces are simultaneously illuminated on the mask, the multilayer system can have different thickness factors on different surface sections, adapted to the ranges of angles of incidence to be expected there.

Figure 11:
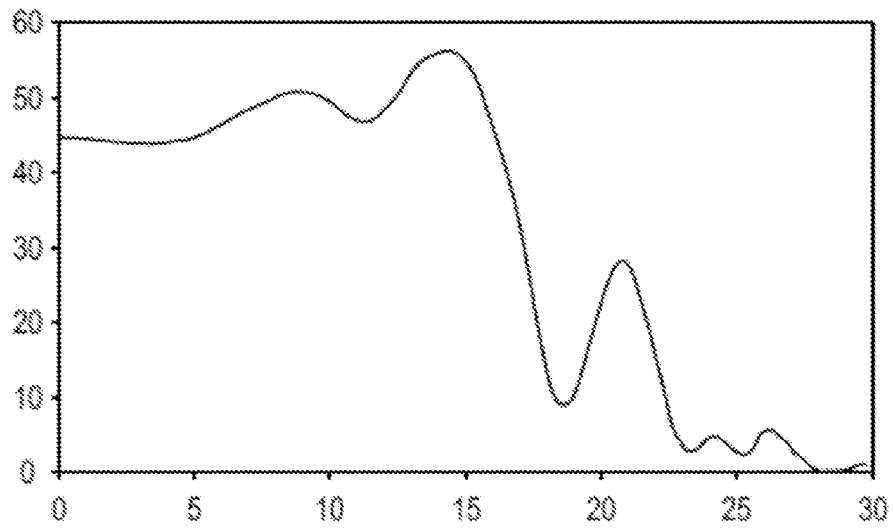
FIG. 11 shows the reflectivity as a function of the angle of incidence for a wavelength for a mask as shown in FIG. 2.

FIG. 11 shows the reflectivity as a function of the incident angle for 13.5 nm for a mask having the following structure of the multilayer system according to FIG. 2:
substrate/ . . . /(4.420 Si 0.373 $B_4C$ 2.185 Mo 0.373 $B_4C$)*28/(3.212 Si 0.373 $B_4C$ 2.009 Mo 0.373 $B_4C$)*5/(3.287 Si 0.373 $B_4C$ 2.979 Mo 0.373 $B_4C$)*15/2.722 Si 0.373 $B_4C$ 1.866 Mo 1.340 Ru The apodization is about 10% both for an interval of angles of incidence of 10° and of 12°. Moreover, reflectivity of substantially above 40% is achieved across the entire interval of angles of incidence, respectively.

Figure 12:
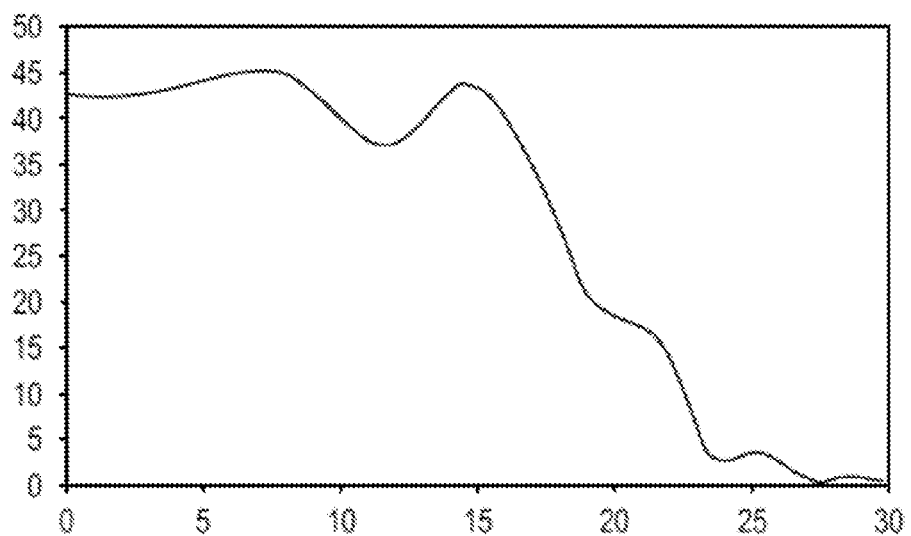
FIG. 12 shows the reflectivity as a function of the angle of incidence for a wavelength for a mask as shown in FIG. 3.

For a mask having the structure
substrate/ . . . /(1.566 Si 0.373 $B_4C$ 5.285 Mo 0.373 $B_4C$)*27/(3.544 Si 0.373 $B_4C$ 2.663 Mo 0.373 $B_4C$)*14/1.399 Si 0.373 $B_4C$ 1.866 Mo 1.340 Ru
corresponding to FIG. 3, the apodization is below 20%, as shown in FIG. 12, both for an interval of angles of incidence of 10° and of 12°.

Figure 13:
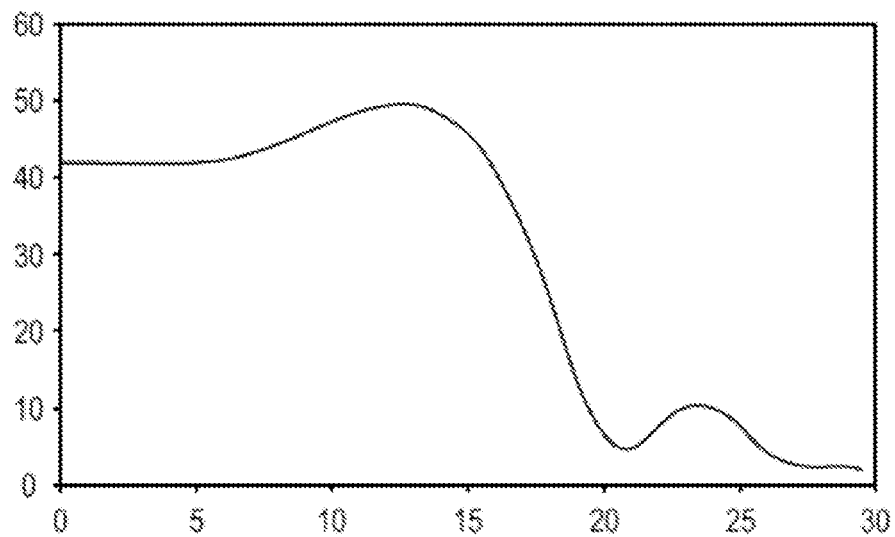
FIG. 13 shows the reflectivity as a function of the angle of incidence for a wavelength for a variant of the mask as shown in FIG. 3.

In the variant discussed with reference to FIG. 3 of the mask shown in FIG. 3 having the structure
substrate/ . . . /(0.4 $B_4C$ 4.132 Mo 0.4 $B_4C$ 2.78 Si)*6/(3.608 Si 0.4 $B_4C$ 3.142 Mo 0.4 $B_4C$)*16/2.027 Si 0.4 $B_4C$ 2 Mo 1.5 Ru
wherein the last silicon layer of the partial system second furthest away from the substrate is followed by the first silicon layer of the partial system furthest away from the substrate, the apodization both for an interval of angles of incidence of 10° and of 12°, is below 20%, and the reflectivity is above 40% throughout, as shown in FIG. 13.

In the embodiment shown in FIGS. 11 to 13, as in the embodiment shown in FIG. 10, the interval of angles of incidence can be displaced towards higher incident angles with sufficiently good apodization and reflectivity, for example, by considering a thickness factor in the multilayer structure.

Good values for apodization and minimum reflectivity, comparable to those achievable with masks having multilayer systems on the basis of silicon and molybdenum across incident angle intervals of 10° or 12°, can also be achieved with masks having multilayer systems on the basis of silicon and ruthenium with, for example, the following structure:
substrate/ . . . /(5.4348 Si 0.4 $B_4C$ 3.0701 Ru 0.4 $B_4C$)*23/5.7348 Si 0.4 $B_4C$ 3.0701 Ru.

Furthermore, masks having multilayer systems can also have the apodization and reflectivity values indicated here, wherein different partial systems have different materials. For example, partial systems on the basis of silicon and molybdenum can be combined with partial systems on the basis of silicon and ruthenium in the ways suggested here for wavelengths of about 13.5 nm.

It should be noted that while exemplary embodiments have been explained for EUV lithography apparatuses having an image scale of 1:4 and a numerical aperture of 0.35 or 0.4, the above explained may easily be transferred to masks of EUV lithography apparatuses having a different numerical aperture and/or image scale.

The above description of the preferred embodiments has been given by way of example. From the disclosure given, those skilled in the art will not only understand the present invention and its attendant advantages, but will also find apparent various changes and modifications to the structures disclosed. The applicant seeks therefore to cover all such changes and modifications as fall within the spirit and scope of the invention, as defined by the appended claims, and equivalents thereof.

The invention claimed is:

1. A reflective mask for extreme-ultraviolet (EUV) lithography comprising:
a reflective multilayer system on a substrate configured for a working wavelength in the EUV range and having stacks with layers of at least two materials with different real parts of the refractive index at the working wavelength,
wherein the multilayer system is configured such that, when irradiated with EUV radiation in a wavelength interval of +/−2% centered on a center wavelength and an angle interval of 12° between a smallest and a largest angle of incidence, apodization of the mask is less than 30%.

2. A reflective mask for extreme-ultraviolet (EUV) lithography comprising:
a reflective multilayer system on a substrate configured for a working wavelength in the EUV range and having stacks with layers of at least two materials with different real parts of the refractive index at the working wavelength,
wherein the multilayer system is configured such that, when irradiated with EUV radiation in a wavelength interval of +/−2% centered on a center wavelength and an angle interval of 12° between a smallest and a largest angle of incidence, reflectivity of the mask is at least 30%.

3. The mask according to claim 2, wherein the multilayer system comprises a plurality of partial systems (P', P'', P'''), each consisting of a periodic sequence of at least two stacks ($P_1$, $P_2$, $P_3$) of individual layers, wherein the layers of a stack within each partial system (P'', P''') have a constant thickness resulting in a stack thickness ($d_2$, $d_3$) different from the stack thickness of a neighbouring partial system, and wherein the first layer (H''') having a higher real part of the reflective index of the partial system (P''') furthest away from the substrate directly follows the last layer (H'') having a higher real part of the refractive index of the partial system (P'') second furthest away from the substrate.

4. The mask according to claim 3, wherein the partial systems (P'', P''') are made of the same materials.

5. The mask according to claim 3, wherein the stack ($P_3$) of the partial system (P''') furthest away from the substrate (S) has a thickness of the layer having a lower real part of the refractive index (L''') which is smaller than 80% of the thickness of the layer having a lower real part of the refractive index (L'') of the stack ($P_2$) of the partial system (P''') second furthest away from the substrate (S).

6. The mask according to claim 3, wherein the stack ($P_3$) of the partial system (P''') furthest away from the substrate (S) has a thickness of the layer having a higher real part of the refractive index (H''') which is more than 120% of the thickness of the layer having a higher real part of the refractive index (H'') of the stack ($P_2$) of the partial system (P''') second furthest away from the substrate (S).

7. The mask according to claim 3, wherein the multilayer system comprises at least three partial systems (P', P'', P''') and the number ($N_1$) of stacks ($P_1$) of the partial system (P')

closest to the substrate (S) is at least one of: (i) greater than that of the partial system (P''') furthest away from the substrate (S) and (ii) greater than that of the partial system (P'') second furthest away from the substrate (S).

8. The mask according to claim 3, wherein the number ($N_2$) of stacks ($P_2$) of the partial system (P'') second furthest away from the substrate has a value between 2 and 12.

9. The mask according to claim 3, wherein the number ($N_3$) of stacks ($P_3$) of the partial system (P''') furthest away from the substrate has a value between 9 and 16.

10. The mask according to claim 2, wherein the multilayer system comprises a plurality of partial systems (P'', P'''), each consisting of a periodic sequence of at least two stacks ($P_2$, $P_3$) of individual layers, wherein the layers of a stack within each partial system (P'', P''') have a constant thickness resulting in a stack thickness ($d_2$, $d_3$) different from the stack thickness of a neighbouring partial system, and wherein the partial system furthest away from the substrate has a number ($N_3$) of stacks ($P_3$) that is larger than the number ($N_2$) of stacks ($P_2$) of the partial system second furthest away from the substrate.

11. The mask according to claim 2, wherein the multilayer system comprises a plurality of partial systems (P'', P'''), each consisting of a periodic sequence of at least two stacks ($P_2$, $P_3$) of individual layers, wherein the layers of a stack within each partial system (P'', P''') have a constant thickness resulting in a stack thickness ($d_2$, $d_3$) which differs from the stack thickness of a neighbouring partial system, and wherein the thickness of the layer (H''') with the higher real part of the refractive index of the partial system furthest away from the substrate differs from the thickness of the layer (H'') having the higher real part of the refractive index of the partial system second furthest away from the substrate by more than 0.1 nm.

12. The mask according to claim 2, wherein, between at least two of the layers of materials having different real parts of the refractive index at the working wavelength, a barrier layer of boron carbide, carbon, silicon nitride, silicon carbide, silicon boride, molybdenum nitride, molybdenum carbide, molybdenum boride, ruthenium nitride, ruthenium carbide, ruthenium boride or a combination thereof is arranged.

13. The mask according to claim 2, wherein, at least for one stack, the material having a higher real part of the refractive index is silicon and the material having a lower real part of the refractive index is ruthenium.

14. The mask according to claim 2, wherein, at least for one stack, the material having a higher real part of the refractive index is silicon and the material having a lower real part of the refractive index is molybdenum.

15. An EUV lithography apparatus comprising a mask according to claim 2.

16. The mask according to claim 1, wherein the multilayer system is configured for a maximum reflectivity in a wavelength range between 13.0 nm and 14.0 nm.

17. The mask according to claim 1, wherein the multilayer system comprises a plurality of partial systems (P', P'', P'''), each consisting of a periodic sequence of at least two stacks ($P_1$, $P_2$, $P_3$) of individual layers, wherein the layers of a stack within each partial system (P'', P''') have a constant thickness resulting in a stack thickness ($d_2$, $d_3$) different from the stack thickness of a neighbouring partial system, and wherein the first layer (H''') having a higher real part of the reflective index of the partial system (P''') furthest away from the substrate directly follows the last layer (H'') having a higher real part of the refractive index of the partial system (P'') second furthest away from the substrate.

18. The mask according to claim 1, wherein the multilayer system comprises a plurality of partial systems (P'', P'''), each consisting of a periodic sequence of at least two stacks ($P_2$, $P_3$) of individual layers, wherein the layers of a stack within each partial system (P'', P''') have a constant thickness resulting in a stack thickness ($d_2$, $d_3$) different from the stack thickness of a neighbouring partial system, and wherein the partial system furthest away from the substrate has a number ($N_3$) of stacks ($P_3$) that is larger than the number ($N_2$) of stacks ($P_2$) of the partial system second furthest away from the substrate.

19. The mask according to claim 1, wherein the multilayer system comprises a plurality of partial systems (P'', P'''), each consisting of a periodic sequence of at least two stacks ($P_2$, $P_3$) of individual layers, wherein the layers of a stack within each partial system (P'', P''') have a constant thickness resulting in a stack thickness ($d_2$, $d_3$) which differs from the stack thickness of a neighbouring partial system, and wherein the thickness of the layer (H''') with the higher real part of the refractive index of the partial system furthest away from the substrate differs from the thickness of the layer (H'') having the higher real part of the refractive index of the partial system second furthest away from the substrate by more than 0.1 nm.

20. The mask according to claim 17, wherein the partial systems (P'', P''') are made of the same materials.

21. The mask according to claim 17, wherein the stack ($P_3$) of the partial system (P''') furthest away from the substrate (S) has a thickness of the layer having a lower real part of the refractive index (L''') which is smaller than 80% of the thickness of the layer having a lower real part of the refractive index (L'') of the stack ($P_2$) of the partial system (P'') second furthest away from the substrate (S).

22. The mask according to claim 17, wherein the stack ($P_3$) of the partial system (P''') furthest away from the substrate (S) has a thickness of the layer having a higher real part of the refractive index (H''') which is more than 120% of the thickness of the layer having a higher real part of the refractive index (H'') of the stack ($P_2$) of the partial system (P'') second furthest away from the substrate (S).

23. The mask according to claim 17, wherein the multilayer system comprises at least three partial systems (P', P'', P''') and the number ($N_1$) of stacks ($P_1$) of the partial system (P') closest to the substrate (S) is at least one of: (i) greater than that of the partial system (P''') furthest away from the substrate (S) and (ii) greater than that of the partial system (P'') second furthest away from the substrate (S).

24. The mask according to claim 17, wherein the number ($N_2$) of stacks ($P_2$) of the partial system (P'') second furthest away from the substrate has a value between 2 and 12.

25. The mask according to claim 17, wherein the number ($N_3$) of stacks ($P_3$) of the partial system (P''') furthest away from the substrate has a value between 9 and 16.

26. The mask according to claim 1, wherein, between at least two of the layers of materials having different real parts of the refractive index at the working wavelength, a barrier layer of boron carbide, carbon, silicon nitride, silicon carbide, silicon boride, molybdenum nitride, molybdenum carbide, molybdenum boride, ruthenium nitride, ruthenium carbide, ruthenium boride or a combination thereof is arranged.

27. The mask according to claim 1, wherein, at least for one stack, the material having a higher real part of the refractive index is silicon and the material having a lower real part of the refractive index is ruthenium.

28. The mask according to claim 1, wherein, at least for one stack, the material having a higher real part of the refractive index is silicon and the material having a lower real part of the refractive index is molybdenum.

29. An EUV lithography apparatus comprising a mask according to claim 1.

* * * * *

UNITED STATES PATENT AND TRADEMARK OFFICE
CERTIFICATE OF CORRECTION

PATENT NO.        : 8,486,590 B2
APPLICATION NO.   : 13/526472
DATED             : July 16, 2013
INVENTOR(S)       : Vladimir Kamenov and Sascha Migura It is certified that error appears in the above-identified patent and that said Letters Patent is hereby corrected as shown below:

Title Page, Item (56), "OTHER PUBLICATIONS": delete "Kuhlmann., T." and insert -- Kuhlmann, T. --

In the Specifications

Column 2, Line 60: delete "several angle" and insert -- several angles --

Column 6, Line 54: delete "the lower" and insert -- a lower --

Column 7, Line 40: delete "and the working wavelength" and insert -- at the working wavelength --

Column 8, Line 47: delete "P"," and insert -- P''', --

Column 9, Line 7: delete "mask M1" and insert -- mask M --

Column 9, Line 11: delete "P"," and insert -- P''', --

Column 10, Line 23: delete "multilayer systems" and insert -- multilayer system --

Column 12, Line 29: after "Ru" insert -- . --

Column 13, Line 19: after "Ru" insert -- . --

Signed and Sealed this
Eighth Day of April, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,486,590 B2
APPLICATION NO. : 13/526472
DATED : July 16, 2013
INVENTOR(S) : Vladimir Kamenov and Sascha Migura Page 1 of 1

It is certified that error appears in the above-identified patent and that said Letters Patent is hereby corrected as shown below:

Title Page, Item (56), "OTHER PUBLICATIONS": delete "Kuhlmann., T." and insert -- Kuhlmann, T. --

In the Specifications

Column 2, Line 66: delete "several angle" and insert -- several angles --

Column 6, Line 54: delete "the lower" and insert -- a lower --

Column 7, Line 40: delete "and the working wavelength" and insert -- at the working wavelength --

Column 8, Line 47: delete "P"," and insert -- P'", --

Column 9, Line 7: delete "mask M1" and insert -- mask M --

Column 9, Line 11: delete "P"," and insert -- P'", --

Column 10, Line 23: delete "multilayer systems" and insert -- multilayer system --

Column 12, Line 29: after "Ru" insert -- . --

Column 13, Line 19: after "Ru" insert -- . --

This certificate supersedes the Certificate of Correction issued April 8, 2014.

Signed and Sealed this
Tenth Day of June, 2014

Michelle K. Lee
*Deputy Director of the United States Patent and Trademark Office*